United States Patent [19]

Nagata et al.

[11] 4,173,740

[45] Nov. 6, 1979

[54] SPEAKER PROTECTION CIRCUIT

[75] Inventors: Yuuichi Nagata; Tadataka Matsuoka, both of Hamamatsu, Japan

[73] Assignee: Nippon Gakki Seizo Kabushiki Kaisha, Hamamatsu, Japan

[21] Appl. No.: 944,781

[22] Filed: Sep. 22, 1978

[30] Foreign Application Priority Data

Sep. 29, 1977 [JP] Japan .......................... 52/131116[U]

[51] Int. Cl.[2] .............................................. H03F 3/04

[52] U.S. Cl. .................................... 330/298; 325/362; 330/207 P; 330/297

[58] Field of Search .................... 325/362; 330/207 P, 330/297, 298

[56] References Cited

U.S. PATENT DOCUMENTS 3,735,203 5/1973 Fujie et al. .................... 330/207 P X 3,818,366 6/1974 Arimura et al. .................. 330/207 P 3,835,412 9/1974 Honda et al. .................... 330/298 X

*Primary Examiner*—Lawrence J. Dahl

*Attorney, Agent, or Firm*—Flynn & Frishauf

[57] ABSTRACT

A speaker protection circuit comprises a detection circuit connected to the output of a power amplifier circuit and detecting overvoltage exceeding a predetermined level developing at the output, and a first relay circuit to disconnect a loudspeaker from the output of the power amplifier circuit when the detection circuit detects the overvoltage, the speaker protection circuit further comprising a second relay circuit which causes a power supply circuit connected with the power amplifier circuit to drop or cut off the supply voltage to the power amplifier circuit when the overvoltage develops at the output of the power amplifier circuit. The second relay circuit has normally closed contacts connected between a secondary winding of a power transformer of the power supply circuit and a rectifier circuit. In order to drop the supply voltage to the power amplifier circuit, a resistor is connected in parallel with the normally closed contacts.

5 Claims, 2 Drawing Figures

SPEAKER PROTECTION CIRCUIT

BACKGROUND OF THE INVENTION

This invention relates to an audio amplifier circuit, and, more specifically, to protection of a loudspeaker connected to the audio amplifier circuit.

In an audio circuit with a power amplifier circuit the output of which is directly connected with a loudspeaker, some abnormal operation on the amplifier side may apply DC overvoltage directly to the loudspeaker, thereby damaging the loudspeaker. Therefore, such circuit is usually provided with a speaker protection circuit. For this protection circuit, there has conventionally been known such one as shown in FIG. 1, for example. In a power amplifier circuit A of FIG. 1, power transistors 2 and 3 driven by a driver 1 are connected in single-ended push-pull relation and, a loudspeaker 7 is directly connected between output terminals 4*a* and 4*b* (ground side) of the power amplifier via normally closed contacts 6*a* and 6*b* of a relay 5. If an abnormal operation of a power amplifier circuit A causes some DC overvoltage to develop between the output terminals 4*a* and 4*b*, a detection circuit 8 will detect this overvoltage to conduct a transistor 9, whereby a current will flow through an electromagnetic coil 10 of the relay 5 to open the contacts 6*a* and 6*b*. As a result, the loudspeaker 7 is disconnected from the output terminal 4*a*, and thus protected from the DC overvoltage. In the abovementioned circuit, however, if supply voltages $V_{CC}$ and $V_{EE}$ are high, the voltage $V_{CC}$ or $V_{EE}$ will be developed between the output terminals 4*a* and 4*b* due to breakdown of the power transistor 2 or 3, with the result that an arc will occurs between the contacts 6*a* and 6*b* to prevent the loudspeaker 7 from being disconnected from the output terminal 4*a*, thereby damaging the loudspeaker 7 by means of overvoltage.

SUMMARY OF THE INVENTION

The object of this invention is to provide a speaker protection circuit capable of dropping or cutting off the supply voltage to a power amplifier circuit in disconnecting a loudspeaker from ther output terminal of the power amplifier circuit when an overvoltage is developed at the output of the power amplifier circuit.

According to this invention, there is provided a speaker protection circuit which comprises a detection circuit connected to the output of a power amplifier circuit and detecting an overvoltage exceeding a predetermined level developed at the output, and a relay circuit having normally closed relay contacts connected between the output of the power amplifier circuit and a loudspeaker and disconnecting the loudspeaker from the output of the power amplifier circuit in response to the detection circuit when the overvoltage is developed at the output of the power amplifier circuit, and a circuit means to cause a power supply circuit supplying DC voltage to the power amplifier circuit to drop or cut off the supply voltage to the power amplifier circuit in response to the detection circuit.

According to an embodiment of the invention, the circuit means is a relay circuit which has normally closed relay contacts connected between a secondary winding of a power transformer of the power supply circuit and a rectifier circuit to supply DC voltage to the power amplifier circuit. In order to drop the supply voltage to the power amplifier circuit, a resistor is connected in parallel with the normally closed contacts. If the normally closed contacts are opened, a voltage drop will be caused across the resistor to drop the supply voltage to the power amplifier.

In this embodiment, the relay contacts of the first relay circuit to disconnect the loudspeaker are arranged in a DC path extending from the output of the power amplifier to ground, while the relay contacts of the second relay circuit to drop the supply voltage to the power amplifier circuit are arranged in an AC path in the power supply circuit. Accordingly, it is harder for an arc to develop between the relay contacts of the second relay relay circuit than between those of the first relay circuit. The resistor connected in parallel with the contacts of the second relay circuit makes it further harder to develop an arc between those contacts. Thus, the relay contacts of the second relay circuit open prior to those of the first relay circuit, thereby dropping the supply voltage to the power amplifier circuit, so that the relay contacts of the first relay circuit will be allowed to open without developing any arc between themselves.

DETAILED DESCRIPTION OF THE PREFERRED EMBODIMENT

Figure 1:
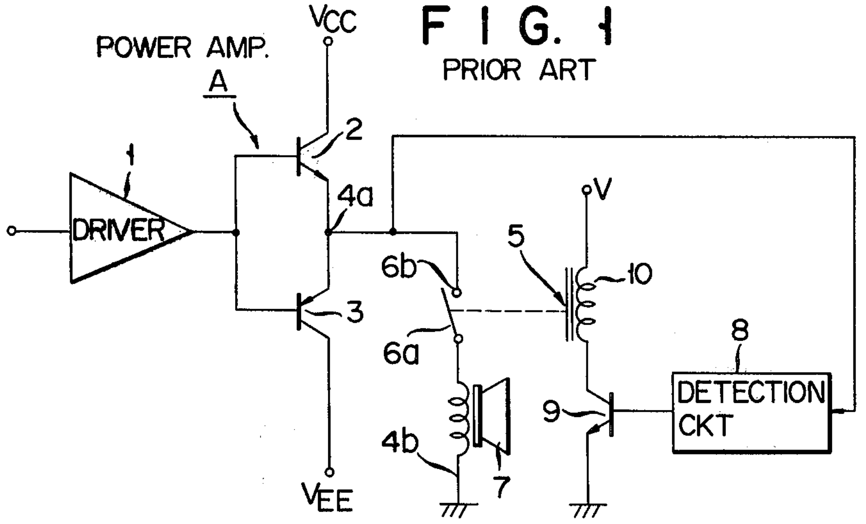
F I G. 1 PRIOR ART
FIG. 1 shows a prior art speaker protection circuit.
Figure 2:
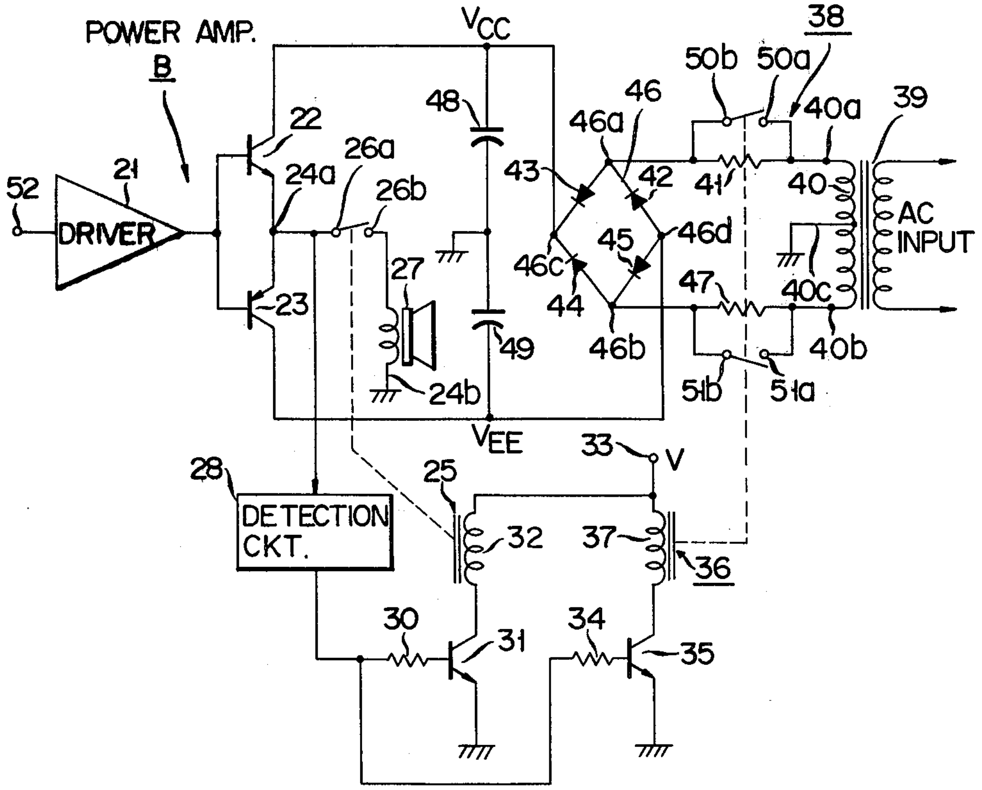
FIG. 2 shows a speaker protection circuit according to an embodiment of this invention.

Referring now to FIG. 2, there will be described an embodiment of this invention. In a power amplifier circuit B, power transistors 22 and 23 driven by a driver 21 are single-ended push-pull connected, and a loudspeaker 27 is connected between output terminals 24*a* and 24*b* (ground side) of the power amplifier via contacts 26*a* and 26*b* of a relay 25. The output terminal 24*a* is further connected to a detection circuit 28 for detecting DC overvoltage, the output terminal of which is connected to the base of a transistor 31 via a resistor 30. The transistor 31 has its collector connected to a positive power supply terminal 33 through an electromagnetic coil 32 of the relay 25, and its emitter grounded. The above-mentioned circuit construction is substantially the same as the one shown in FIG. 1, in which the relay 25 is driven to open the contacts 26*a* and 26*b* when DC overvoltage is developed between the output terminals 24*a* and 24*b*. The output terminal of the detection circuit 28 is also connected to the base of a transistor 35 via a resistor 34. The transistor 35 has its collector connected to the positive power terminal 33 through an electromagnetic coil 37 of a relay 36, and its emitter grounded. Further, a power supply circuit 38 of the power amplifier circuit B is constructed as follows. That is, a primary winding of a power transformer 39 is connected to an AC power source (not shown) and its secondary winding 40 has one output terminal 40*a* connected to one input terminal 46*a* of a bridge rectifier circuit 46 composed of diodes 42, 43, 44 and 45 through a resistor 41, the other output terminal 40*b* connected to the other input terminal 46*b* of the rectifier circuit 46 via a resistor 47 and a center tap 40*c* grounded. One output terminal 46*c* of the rectifier circuit 46 is grounded through a smoothing capacitor 48 and connected to the collector of the power transistor 22, while the other output terminal 46*d* is grounded through a smoothing capacitor 49 and connected to the collector of the power transistor 23. The resistor 41 is connected at both ends to contacts 50*a* and 50*b* of the relay 36, while the resistor 47 is connected at both ends to contacts 51*a* and 51*b* of the relay 36. Numeral 52 designates the input terminal of the power amplifier circuit B.

Now there will be described the operation of the circuit constructed as aforesaid. A signal applied to the input terminal 52 is usually amplified by means of the driver 21 and the power amplifier B, and the loudspeaker 27 is driven by the output of the power amplifier B. In the normal operation, the DC voltage between the output terminals 24*a* and 24*b* is below a predetermined level. At this time, the transistors 31 and 35 are in the nonoperating state, and the contacts 26*a* and 26*b* of the relay 25, as well as the contacts 50*a* and 50*b* of the relay 36, are closed. If DC overvoltage above the predetermined level is developed between the output terminals 24*a* and 24*b* due to breakdown of the power transistor 22 or 23, for example, the detection circuit 28 will detect this overvoltage to render the transistors 31 and 35 conductive, whereby a current will flow through the respective electromagnetic coils 32 and 37 of the relays 25 and 36 so that their contacts open. In this case, the contacts 50*a*, 50*b*, 51*a* and 51*b* are opened first, and then the contacts 26*a* and 26*b* are opened. Since an AC current flows through the contacts 50*a*, 50*b*, 51*a* and 51*b*, it is harder for an arc to develop between those contacts than between the contacts 26*a* and 26*b* through which a DC current is to flow. Moreover, the resistors connected in parallel with the former contacts make it further sufficient to develop arcs therebetween, so that those contacts will open first. When the contacts 50*a*, 50*b*, 51*a* and 51*b* are opened, the resistors 41 and 47 are interposed between the output terminals 40*a* and 40*b* of the secondary winding 40 of the power transformer 39 and the input terminals 46*a* and 46*b* of the rectifier circuit 46 so that the voltages at the output terminals 46*c* and 46*d* of the rectifier circuit 46, i.e. voltages $V_{CC}$ and $V_{EE}$ applied to the respective collectors of the power transistors 22 and 23, are reduced due to a voltage drop developed across the resistors 41 and 47, thereby dropping the DC overvoltage caused between the output terminals 24*a* and 24*b*. Therefore, an arc developing between the contacts 26*a* and 26*b* accompanying the generation of the overvoltage, if any, will die away at once, and the contacts 26*a* and 26*b* will be opened subsequently to the contacts 50*a*, 50*b*, 51*a* and 51*b*. Thus, owing to the opening of the contacts 26*a* and 26*b*, the loudspeaker 27 will be able to get clear of the influence of the DC overvoltage.

Although in the aforementioned embodiment the resistors 41 and 47 are disposed in the power supply circuit 38 when the relay 36 is driven, thereby dropping the supply voltage to the power amplifier circuit B, when the overvoltage is produced between the output terminals 24*a* and 26*b* of the power amplifier circuit B, the power supply circuit 38 may alternatively be so constructed as to cut off the power supply to the power amplifier B. To achieve this, it is only required that the resistors 41 and 47 be removed.

It should be also noted that a single common transistor and electromagnetic coil may be provided to control the three pairs of relay contacts 26*a*, 26*b*, 50*a*, 50*b*, 51*a* and 51*b* or a single common transistor may be provided to drive the pair of electromagnetic coils 32 and 37.

What we claim is:

1. An audio amplifier circuit with speaker protection, comprising:

a power amplifier circuit having an output to which a loudspeaker is connected;

a power supply circuit connected with said power amplifier circuit and supplying a DC voltage to said power amplifier circuit;

a detection circuit connected to the output of said power amplifier circuit and detecting an overvoltage exceeding a predetermined level developed at said output;

a relay circuit means connected to said detection circuit and having normally closed contacts connected to the output of said power amplifier circuit to connect said loudspeaker to the output of said power amplifier circuit, said relay circuit means opening said contacts in response to said detection circuit when said overvoltage above the predetermined level is developed at the output of said power amplifier circuit, thereby disconnecting said loudspeaker from the output of said power amplifier circuit; and a means connected to said detection circuit and power supply circuit and causing said power supply circuit to drop the supply voltage to said power amplifier circuit in response to said detection circuit when said overvoltage is developed at the output of said power amplifier circuit.

2. An audio amplifier circuit with speaker protection, comprising:

a power amplifier circuit having an output to which a loudspeaker is connected;

a power supply circuit connected with said power amplifier circuit and supplying DC voltage to said power amplifier circuit;

a detection circuit connected to the output of said power amplifier circuit and detecting an overvoltage exceeding a predetermined level developed at said output;

a relay circuit means connected to said detection circuit and having normally closed contacts connected to the output of said power amplifier circuit to connect said loudspeaker to the output of said power amplifier circuit, said relay circuit means opening said contacts in response to said detection circuit when said overvoltage above the predetermined level is developed at the output of said power amplifier circuit, thereby disconnecting said loudspeaker from the output of said power amplifier circuit; and a means connected to said detection circuit and power supply circuit and causing said power supply circuit to cut off the supply voltage to said power amplifier circuit in response to said detection circuit when said overvoltage is developed at the output of said power amplifier circuit.

3. An audio amplifier circuit with speaker protection, comprising:

a power amplifier circuit having an output to which a loudspeaker is connected;

a power supply circuit connected with said power amplifier circuit and supplying a DC voltage to said power amplifier circuit, said power supply circuit including a power transformer having a primary winding across which an AC voltage is applied and a secondary winding, and a rectifier circuit connected to said secondary winding;

a detection circuit connected to the output of said power amplifier circuit and detecting an overvoltage exceeding a prescribed level developed at said output;

a first relay circuit means connected to said detection circuit and having first normally closed contacts connected to the output of said power amplifier circuit to connect said loudspeaker to the output of said power amplifier circuit, said first relay circuit means opening said first contacts in response to said detection circuit when said overvoltage above the prescribed level is developed at the output of said power amplifier circuit, thereby disconnecting said loudspeaker from the output of said power amplifier circuit; and a second relay circuit means connected to said detection circuit and power supply circuit, said second relay circuit means having second normally closed contacts connected between said secondary winding of said power transformer and said rectifier circuit and opening said second contacts in response to said detection circuit when said overvoltage is developed at the output of said power amplifier circuit.

4. An audio amplifier circuit according to claim 3, wherein a resistor is connected in parallel with said second normally closed contacts.

5. An audio amplifier circuit according to claim 1 or 2, in which said power supply circuit comprises a rectifier circuit receiving an AC source voltage to produce said DC voltage, and said means connected to said power supply circuit comprises another relay circuit means having other normally closed contacts connected in an AC voltage path in said power supply circuit, said other contacts being opened when said overvoltage is developed at the output of said power amplifier circuit.

* * * * *